(12) United States Patent
Gammel et al.

(10) Patent No.: US 7,707,445 B2
(45) Date of Patent: Apr. 27, 2010

(54) INTEGRATED CIRCUIT

(75) Inventors: Berndt Gammel, Markt Schwaben (DE); Thomas Kunemund, Munich (DE)

(73) Assignee: Infineon Technologies AG, Neubiberg (DE)

( * ) Notice: Subject to any disclaimer, the term of this patent is extended or adjusted under 35 U.S.C. 154(b) by 479 days.

(21) Appl. No.: 11/202,944

(22) Filed: Aug. 12, 2005

(65) Prior Publication Data

US 2006/0036884 A1 Feb. 16, 2006

Related U.S. Application Data

(63) Continuation of application No. PCT/DE2004/000768, filed on Apr. 14, 2004.

(30) Foreign Application Priority Data

May 26, 2003 (DE) ................. 103 23 861

(51) Int. Cl.
*G06F 1/32* (2006.01)
(52) U.S. Cl. .................. 713/324; 713/300; 713/320
(58) Field of Classification Search .......... 713/300–375
See application file for complete search history.

(56) References Cited

U.S. PATENT DOCUMENTS

| | | | |
|---|---|---|---|
| 5,204,840 A | | 4/1993 | Mazur |
| 5,477,476 A | * | 12/1995 | Schanin et al. ............. 713/324 |
| 6,219,796 B1 | * | 4/2001 | Bartley ....................... 713/320 |
| 6,282,666 B1 | * | 8/2001 | Bays et al. .................. 713/323 |
| 6,363,501 B1 | * | 3/2002 | Tobias et al. ................ 714/30 |
| 7,174,472 B2 | * | 2/2007 | Hill ............................ 713/323 |
| 2002/0060947 A1 | | 5/2002 | Hatae |
| 2002/0105845 A1 | | 8/2002 | Hidaka |
| 2002/0186040 A1 | | 12/2002 | Ooishi |
| 2004/0023680 A1 | * | 2/2004 | Hulvey ...................... 455/522 |

FOREIGN PATENT DOCUMENTS

| | | |
|---|---|---|
| DE | 693 16 417 T2 | 5/1998 |
| EP | 0 964 519 A2 | 12/1999 |
| EP | 0 993 116 A1 | 4/2000 |
| WO | WO-01/33322 A2 | 5/2001 |

OTHER PUBLICATIONS

Shigematsu, S. et al.; "A 1-V High-Speed MTCMOS Circuit Scheme for Power-Down Application Circuits"; IEEE Journal of Solid-State Circuits, IEEE Inc. of New York, US, vol. 32, No. 6, Jun. 1997, pp. 861-869.

* cited by examiner

*Primary Examiner*—Thomas Lee
*Assistant Examiner*—Paul B Yanchus, III
(74) *Attorney, Agent, or Firm*—Dickstein, Shapiro, LLP.

(57) ABSTRACT

An integrated circuit having a first circuit unit, which is put into a power-saving mode by a control apparatus and into a predetermined initial state when changing from the power-saving mode to a regular operating state. A second circuit unit is put into a power-saving mode by the control apparatus, during which the second circuit unit buffer-stores data and/or instructions adopted immediately prior to the power-saving state, with the second circuit unit resuming and providing the data and/or instructions when changing from the power-saving mode to the regular operating state. The second circuit unit has an input connection to which a first potential is applied in order to change to the power-saving mode and during the power-saving mode, and to which a second potential is applied in order to change to the operating state and during the operating state.

24 Claims, 6 Drawing Sheets

INTEGRATED CIRCUIT

CROSS-REFERENCE TO RELATED APPLICATION

This application is a continuation of International Patent Application Ser. No. PCT/DE2004/000768, filed Apr. 14, 2004, which published in German on Dec. 16, 2004 as WO 2004/109921, and is incorporated herein by reference in its entirety.

FIELD OF THE INVENTION

The application relates to an integrated circuit and to a method for operating the integrated circuit, particularly for putting said integrated circuit into a power-saving mode.

BACKGROUND OF THE INVENTION

Integrated circuits for battery-operated systems, such as mobile telephones, or for contactlessly operated systems, such as chip cards, can have only a particular minimum power consumption, stipulated by standards, in "standby" or "sleep" mode. During the standby or sleep mode, which are also called power-saving mode, no arithmetic operations or other signal changes are executed within the integrated circuit.

One method for saving energy involves all those parts of the integrated circuit being isolated from the supply voltage in power-saving mode whose electrical operation is not required again until the integrated circuit leaves the power-saving mode and resumes its normal operation or regular operating state. Circuit units which can be readily transferred to a power-saving mode contain, by way of example, circuit elements for producing control signals whose storing elements are permitted to lose their information in the power-saving mode because they are automatically set to a particular initial state (reset) before the regular operating state is resumed.

There are also circuit units, such as parts of the CPU (Central Processing Unit) in the integrated circuit, whose isolation from the supply voltage would result in a loss of energy and/or time or even in a loss of information when this circuit unit is put into the regular operating state again. Such circuit units include, by way of example, SRAMs, cache memories, register files and parts of data paths. Said circuit units contain instructions and data for the CPU and also its intermediate results and state registers, such as the "program status word" (PSW) and the "program counter" (PC).

SUMMARY OF THE INVENTION

It is therefore an object of the present invention to specify an integrated circuit and a method for operating the integrated circuit which avoids a loss of time and/or energy and also a loss of data when changing from an operating state to a power-saving mode and back.

The inventive integrated circuit distinguishes between first circuit units, which can be put into a power-saving mode by a control apparatus, with the first circuit units being put into a predetermined initial state when changing from the power-saving mode to their regular operating state, and second circuit units, which can be put into a power-saving mode by the control apparatus, during which they store the data and/or instructions adopted immediately prior to the power-saving state, with the second circuit units resuming and providing these data and/or instructions when changing from the power-saving mode to their operating state. The second circuit unit has an input connection to which a first potential can be applied for the purpose of changing to the power-saving mode and during this mode, and to which a second potential can be applied for the purpose of changing to the operating state and during said operating state.

BRIEF DESCRIPTION OF THE DRAWINGS

Further advantages, features and expediencies of the invention are explained in more detail with reference to the figures which are described below, in which.

DETAILED DESCRIPTION OF PREFERRED EMBODIMENTS OF THE INVENTION

The inventive integrated circuit distinguishes between first circuit units, which can be put into a power-saving mode by a control apparatus, with the first circuit units being put into a predetermined initial state when changing from the power-saving mode to their regular operating state, and second circuit units, which can be put into a power-saving mode by the control apparatus, during which they store the data and/or instructions adopted immediately prior to the power-saving state, with the second circuit units resuming and providing these data and/or instructions when changing from the power-saving mode to their operating state.

The invention is based on the insight that the second circuit units are not permitted to be isolated from the supply voltage and that, in power-saving mode, they need to be electrically isolated from all those circuit parts, that is to say the first circuit units, since these are isolated from the supply voltage and hence their output signals in the power-saving mode are not at a fixed electrical potential. For this train of thought, it is assumed that there is an electrical connection between at least some of the first and second circuit units.

The electrical isolation between a first and a second circuit unit therefore needs to be provided such that the indefinite electrical potential of an output signal from the first circuit unit results in no kind of short-circuit currents or energy losses in the second circuit unit, which continues to be connected to supply voltage. The isolation needs to be provided such that all information required for resuming the regular operating state has previously been ascertained and has been stored before changing to the power-saving mode. When changing from the power-saving mode to the regular operating state, it is also necessary to ensure that the first and second circuit units resume the operating state "synchronously". This means that parts of the second circuit unit need to be put into a state which is compatible with or corresponds to the reset state indicated at the outset.

Provision is therefore made for the second circuit unit to have an input connection to which a first potential can be applied for the purpose of changing to the power-saving mode and during this mode, and to which a second potential can be applied for the purpose of changing to the operating state and during said operating state. Preferably, the first potential applied to the input connection of the second circuit unit is the supply potential of the integrated circuit, while the second potential is the reference potential of the integrated circuit.

In one advantageous refinement, the second circuit unit has a plurality of further input connections which do not have to have a defined potential in the power-saving mode.

Only a single one of the input signals for the second circuit unit needs to have a defined value for the electrical potential in the power-saving mode. This signal is connected to reference potential (logic 0) in the normal operation or in the regular operating state, whereas it is connected to the supply potential (logic 1) in the power-saving mode. All other input signals for the second circuit unit may be at an indefinite electrical potential in the power-saving mode without this resulting in an increased loss of energy. This relates both to data and control inputs and to all clock and reset inputs.

In one preferred refinement, the second circuit unit has a control unit which controls and monitors the buffer-storage of the data and instructions when changing from the operating state to the power-saving mode.

It is also advantageous if the input connection, to which the second potential is connected in the operating state and to which the first potential is connected in the power-saving mode, is connected to the control unit.

In one advantageous refinement, the control unit has a switching means which is connected to the input connection and which converts an external clock signal, an external reset signal into an internal clock signal and internal reset signals. The switching means is thus a synchronization device.

This switching means preferably has a clock generator connected to it which is supplied with the internal clock signal and with the internal reset signal for the purpose of producing further clock signals and reset signals. Particular levels are particularly advantageous for the latter signals and for operation in power-saving mode. This becomes obvious from the rest of the description.

In a further refinement, the clock generator is connected to a storage means and to a register arrangement, these being able to be supplied with the further clock signal, which was produced by the clock generator. The storage means has circuit elements whose storing elements are intended to retain their value in the power-saving mode. The register arrangement contains circuit elements whose nature is such that signals applied to their data input are electrically isolated if their clock signal inputs are at an inactive level.

Expediently, the clock generator is connected to the register arrangement, with the register arrangement being able to be supplied with the further reset signal.

It is advantageous if a status monitoring section connected to the aforementioned switching means is provided which prevents the second circuit unit from changing to a power-saving mode while said circuit unit is still active. The status monitoring section thus allows the second circuit unit to reach a safe state in which it stores all data and instructions in the storage elements provided for this purpose before the integrated circuit is transferred to a power-saving mode. When changing from this mode to the operating state, the data and instructions buffer-stored in advance can be retrieved again and are available for further processing.

In a further advantageous refinement, the integrated circuit has at least one further circuit unit. Expediently, each of the second circuit units is provided with one of the control units described above. It is also expedient if each of the second circuit units is connected to the control apparatus.

In a further advantageous refinement, one of the second circuit units can change to the power-saving mode only when each of the second circuit units has reached a safe operating state. This is because an integrated circuit normally comprises a plurality of autarkic subcircuits, i.e. first and second circuit units. These may be in different states for performing a task. If one of these circuit units is instructed to transfer the system to the power-saving mode, then the system generally has no information about the present operating state of the other circuit units. The control apparatus therefore cannot readily turn off the voltage supply for all circuit units simultaneously, since the other circuit units, particularly the second circuit units, may be in an operating state whose termination might result in a loss of data. The further second circuit units therefore need to be able to conclude information that is in progress and data from the storage elements which are to be turned off need to be saved to a permanently operating memory area before the circuit units are isolated from the supply potential.

The inventive method for operating the integrated circuit has the following features:
the second potential is applied to the input connection of the second circuit unit while the latter is operating,
the first potential is applied to the input connection of the second circuit unit in order to change from the operating state to the power-saving mode and during the power-saving mode, and
the second potential is applied to the input connection of the second circuit unit again in order to change from the power-saving mode to the operating state.

In this context, it is advantageous if the operating state of the integrated circuit, particularly the change from the operating state to the power-saving mode and vice versa, is controlled and monitored by the control apparatus.

In line with one development of the inventive method, the change from the operating state to the power-saving mode takes place only when the second circuit unit has reached a safe operating state.

When there are a plurality of second circuit units it is advantageous if one of the second circuit units can change only when each of the second circuit units has reached a safe operating state.

In this context, it is conceivable for the second circuit units to be put into the power-saving state synchronously or successively.

Figure 1:
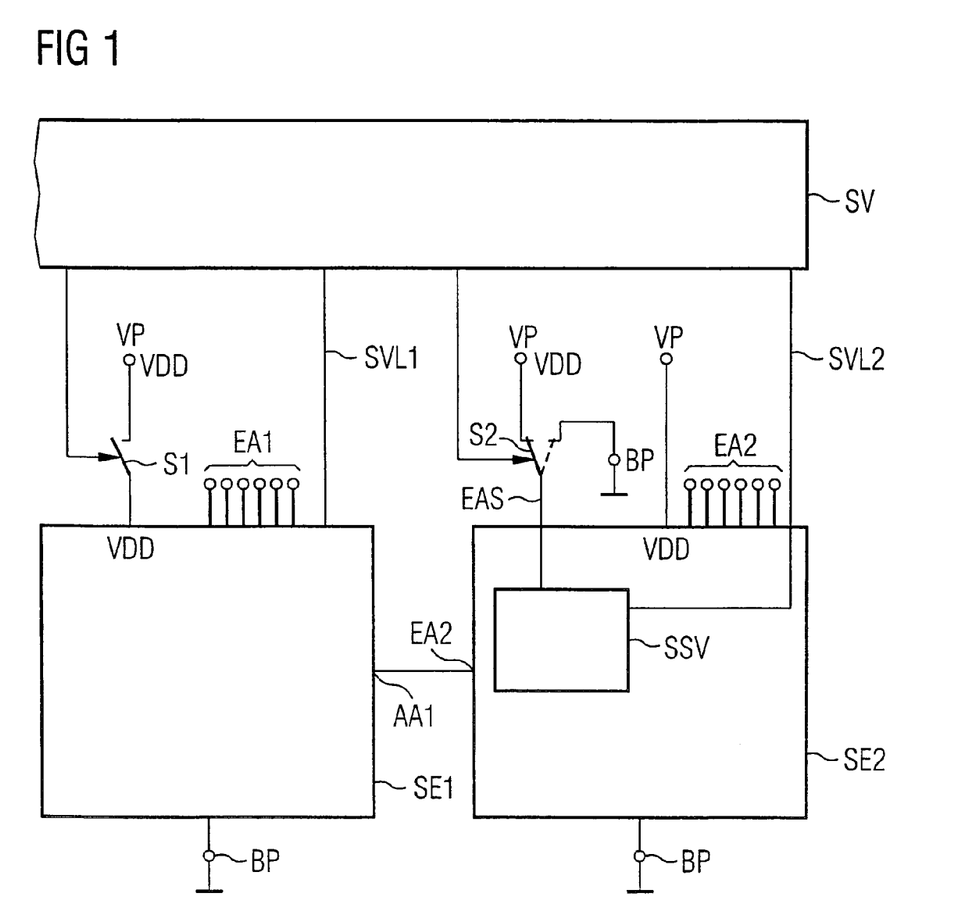
FIG. 1 shows a schematic block diagram of the inventive integrated circuit.

FIG. 1 shows the inventive integrated circuit in a block diagram. The integrated circuit has a first circuit unit SE1 which is put into a predetermined initial state, e.g. by means of a reset, when changing from the power-saving mode to its regular operating state. The first circuit unit SE1 can be connected by means of a switch S1 to a supply potential connection VP, to which a supply potential VDD is applied. It is also connected to a reference potential connection BP, to which a reference potential, e.g. ground, is applied. In addition, input connections EA1 are provided to which data and control signals are applied, for example. The input connections EA1 also comprise clock and reset inputs. In other words, all signals and data which are required for operating the first circuit unit are supplied via the input connections EA1.

There is also a second circuit unit SE2, which, by way of example, comprises memory macros such as SRAMs, cache memories, register files and parts of data paths. This circuit unit is connected to a supply potential connection VP, to which the supply potential VDD is applied. In addition, the second circuit unit SE2 can be connected by means of a switch S2 to a further supply potential connection VP or to a reference potential connection, to which the supply potential VDD or a reference potential, e.g. ground, is applied. In addition, a further reference potential connection BP is provided to which the reference potential, e.g. ground, is permanently applied. Finally, the second circuit unit SE2 has input connections EA2, which comprise data and control inputs and also clock and reset inputs. One of the input connections EA2 may be connected to an output connection AA1 of the first circuit unit if required (as shown in the figure).

There is also a control apparatus SV which is connected to the first or second circuit unit SE1, SE2 via lines SVL1 or SVL2. These lines SVL1, SVL2 can be used to interchange control signals between the circuit units and the control apparatus.

In particular, the control apparatus SV undertakes control of the switches S1 and S2. The switch position of these switches S1, S2 is dependent on which state—the regular operating state or a power-saving mode—the integrated circuit is in. The switch S1 is closed when the integrated circuit, and particularly the circuit unit SE1, is in a regular operating state. In the regular operating state, the switch S2 is in the position shown in dashes, and connects the input connection EAS to a reference potential connection BP, to which the reference potential is applied. In a power-saving mode, on the other hand, the switch S1 is open, and the switch S2 connects the input connection EAS to the supply potential connection VP.

In order to meet the demands, cited at the outset, that the second circuit unit SE2 must not be isolated from the supply voltage in a power-saving mode and needs to be electrically isolated from the first circuit unit, since the latter's output connection AA1 has an output signal which is not at a fixed electrical potential, there is also a control unit SSV which is connected to the input connection EAS and to the line SVL2.

Figure 2:
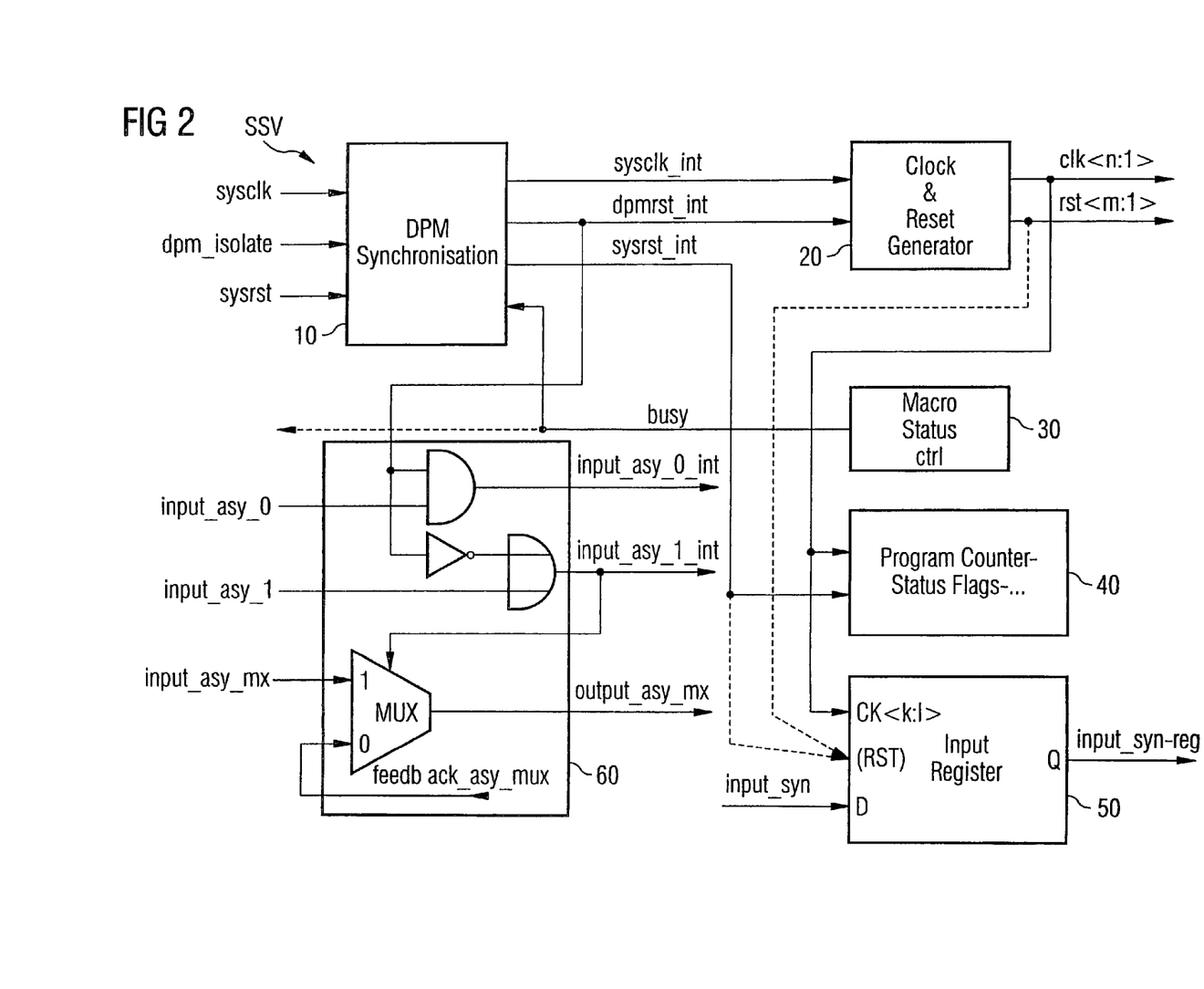
FIG. 2 shows a schematic block diagram of the control unit from FIG. 1.
Figure 3:
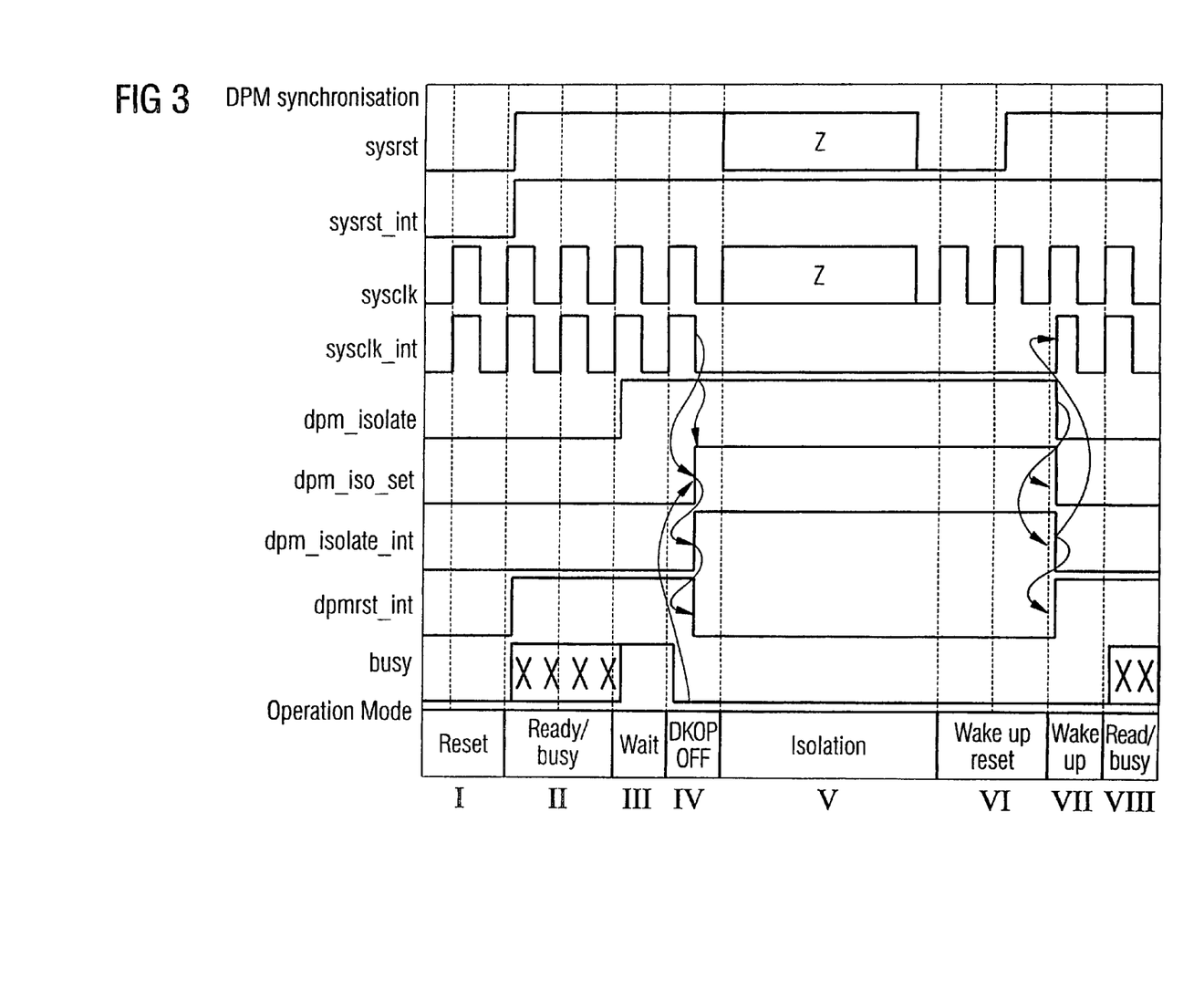
FIG. 3 shows the time profiles of various signals from FIG. 2.

The precise way in which the control unit SSV works is explained in more detail with reference to the figures below. FIG. 2 shows a block diagram of the control unit SSV, and FIG. 3 shows the timing of the signals shown in FIG. 2.

The switching means 10 (DPM synchronization) takes the system clock sysclk, the system reset sysrst, the signal dpm_isolate, which is applied to the input connection EAS, and the internal signal busy and produces the internal clock sysclk_int and also the internal reset signals sysrst_int and dpmrst_int.

An active signal busy indicates that the second circuit unit SE2 is currently busy, that is to say (still) cannot be put into the power-saving mode. The signal busy is produced by a status monitoring section 30 (macro status ctrl). A clock generator 20 (clock and reset generator) takes the signals sysclk_int and dpmrst_int and produces the n different clock signals clk<n:1> and m different reset signals rst<m:1> which are required for operating the second circuit unit.

A storage means 40 contains circuits whose storing elements are intended to keep their value in the power-saving state. They may therefore be reset only in normal operation by an active signal sysrst, which is supplied to the switching means 10, and are therefore connected to the internal reset signal sysrst_int, which is inactive in the power-saving mode. There is also a connection to the clock generator 20. In this case, the storage means 40 are supplied with the clock signals clk<j> which are inactive in the power-saving mode.

A register arrangement 50 contains circuit elements which are designed such that signals input_syn which are applied to their data input D are electrically isolated if the clock inputs connected to clk<k:1> are at an inactive level. The register arrangement may optionally also have set and/or reset inputs.

Figure 5:
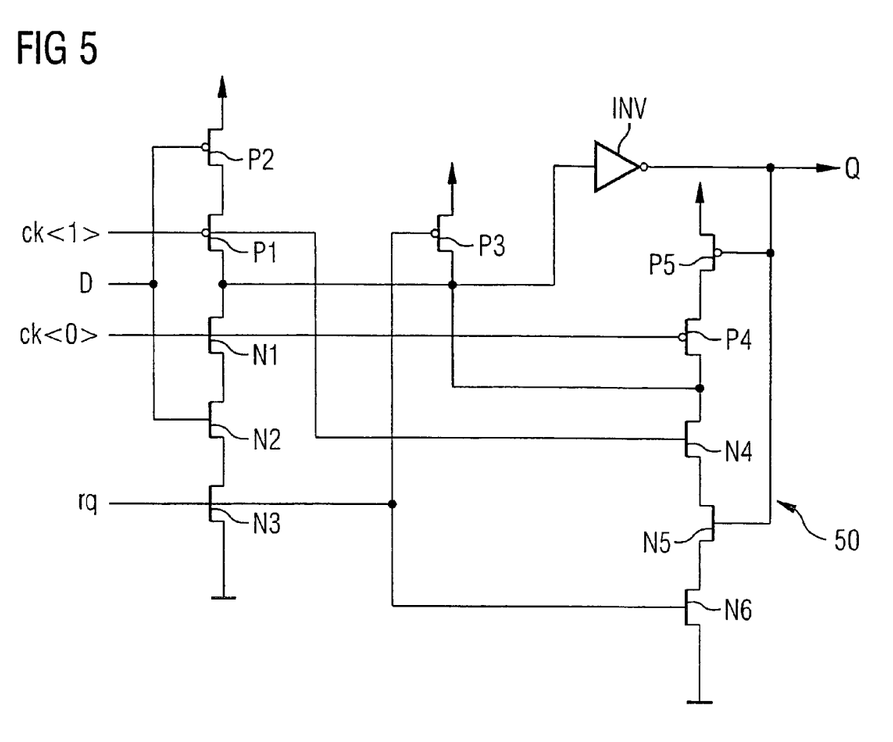
FIG. 5 shows one possible embodiment of the register arrangement from FIG. 2.

FIG. 5 shows one possible exemplary embodiment of the register arrangement 50, a "C²MOS latch". For ck<1>=1 and ck<0>=0, the transistors P1 and N1 are off and the data input D is thus electrically isolated such that an indefinite and slowly variable potential applied to the data input D can have only a small influence on the current drawn by the register arrangement 50. In the present case, the register arrangement 50 also has a reset input rq, which is active when rq=0.

FIG. 2 also shows how "asynchronous" input signals input_asy_0, input_asy_1 and input_asy_mx are electrically isolated (circuit block 60). The asynchronous input signals are signals which are not connected to the input of a register, such as in FIG. 5, but rather are connected to the inputs of combinational logic gates.

Figure 4:
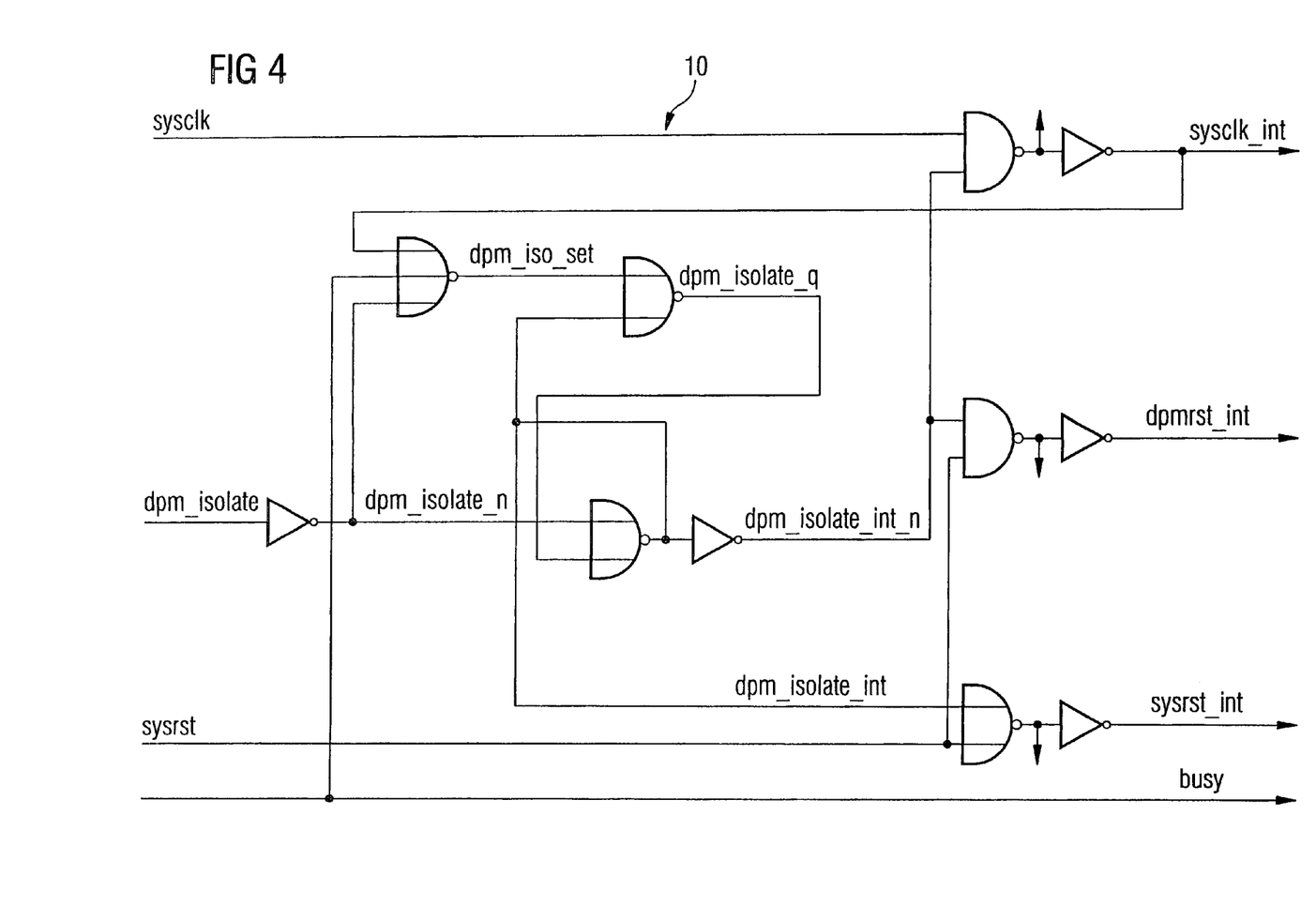
FIG. 4 shows one possible embodiment of the switching means from FIG. 2.

FIG. 4 shows an example of a circuit arrangement for the switching means 10 from FIG. 2 which can be used to achieve the timing for the relevant signals sysclk_int, sysrst_int and dpmrst_int which is required for the electrical isolation, and which is described in FIG. 3.

This circuit can best be understood by considering the signal profiles indicated in FIG. 3 for the signals which are shown in FIG. 2.

Phase I (reset) arises when sysrst=0 and dpm_isolate=0. It follows from this that both internal reset signals are active, i.e. sysrst_int=0 and dpmrst_int=0. This means that the internal clocks clk<n:1> are inactive and the internal reset signals rst<m:1> are active. In addition, sysrst_int=0 puts the storing elements of the storage means 40 into a defined state. The state shown in phase I can last for any length of time—with and without a valid external clock signal.

Phase II (ready/busy) arises when sysrst=1 and dpm_isolate=0. The result of this is that neither of the two internal reset signals is active, i.e. sysrst_int=1 and dpmrst_int=1. In other words, this means that the second circuit unit SE2 is in a regular operating state. It is thus either in standby (busy=0) or is currently busy (busy=1). This state can last any number of clock cycles.

Phase III (wait) arises when sysrst=1, dpm_isolate=1 and busy=1. This signal sequence means that there is a request to change from the regular operating state to the power-saving mode, but this request is not yet permitted, since the second circuit unit SE2 is still active. This means that all internal reset signals remain inactive and all internal clocks continue. This state, i.e. busy=1, may last one or more clock cycles. However, it may not even arise at all, if busy=0, when the signal dpm_isolate_int needs to be activated or if the signal busy is not needed at all, since it is known that the second circuit unit SE2 cannot be busy, for example.

Phase IV (drop off) arises when sysrst=1, dpm_isolate=1 and busy=0. In this clock cycle, the signal dpmrst_int becomes active, i.e. dpmrst_int=0, and the internal clock sysclk_int remains at 0, while sysrst_int=1 and thus remains inactive. The storing elements within the storage means thus keep their value, while the outputs of the clock generator 20 are reset. This means that the internal clocks clk<n:1> become inactive, while the internal reset signals rst<m:1> become active. The result of this is that all synchronous inputs input_syn of the register arrangement 50 are electrically isolated from the first circuit unit SE1.

Since the signal dpmrst_int=0, this also applies for the asynchronous inputs: regardless of the potential levels of the nodes input_asy_0, input_asy_1 and input_asy_mx, the internal nodes corresponding thereto are held at the potential levels 0, 1 or that of the signal feedback_asy_mx. The latter applies particularly for the asynchronous inputs sysrst and sysclk (cf. FIG. 4).

During phase V (dpm isolation), the signal dpm_isolate=1 is maintained, i.e. the state brought about beforehand in phase IV and described above remains (for any length of time, in principle). It is thus possible for all input signals associated with the second circuit unit SE2, including its reset input sysrst and its clock input sysclk, to assume undefined potential levels without resulting in increased drawn current.

Phase VI (wake up reset) arises when sysrst=0, dpm_isolate=1. This phase, lasting one or more clock cycles, changes nothing about the situation described above. Rather, the signal sysrst (which is now active) is intended to put that part of the overall system which is intermittently isolated from the supply voltage and connected to it again in the meantime into a defined state before operation is resumed.

Phase VII (wake up) arises when the signal sysrst=1 and the signal dpm_isolate changes from 1 to 0. This makes the internal reset signal dpmrst_int inactive, and the external clock sysclk is switched through to the internal clock sysclk_int. This is indicated by the causality arrows shown in FIG. 3.

The next phase VIII corresponds to phase II (ready/busy), which has already been explained.

Figure 6:
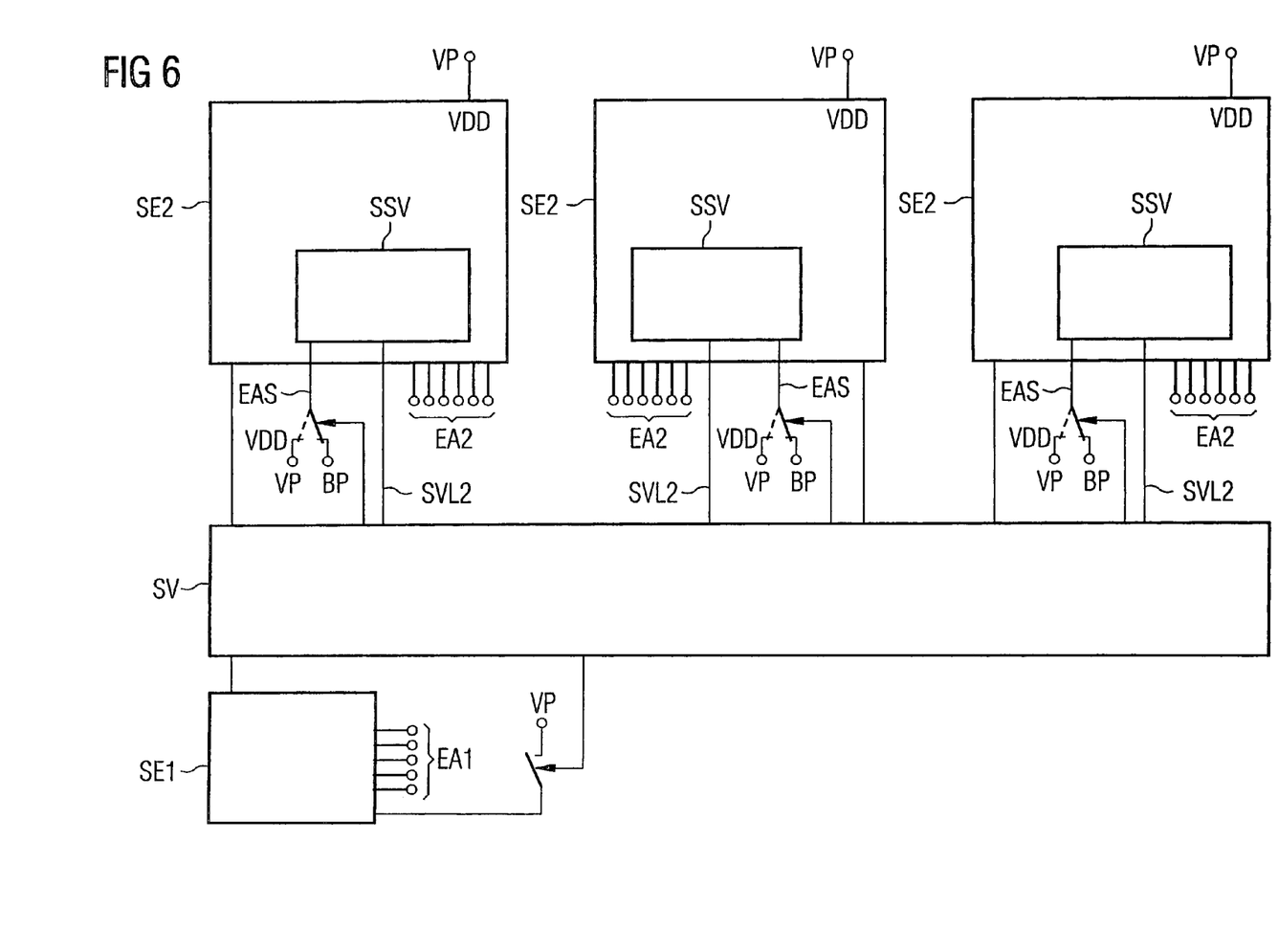
FIG. 6 shows a schematic illustration of an integrated circuit having a plurality of second circuit units.

Finally, FIG. 6 shows the block diagram for an exemplary embodiment in which the integrated circuit has a plurality of second circuit units SE2. Each of the circuit units SE2 has a control unit SSV which is respectively connected to the control apparatus SV. Merely as an example, the figure shows a single first circuit unit SE1, although the integrated circuit could also have a plurality of first circuit units SE1.

Although FIG. 6 shows the integrated circuit only very schematically, all circuit units may be electrically connected to one another, e.g. via a bus system.

In the case of integrated circuits with a plurality of second circuit units SE2, the difficulty is that these are in different states for processing a task. By way of example, the integrated circuit may comprise a plurality of processors, with each processor being formed by a second circuit unit SE2, for example. If one of these processors is instructed by the control apparatus SV to put the entire integrated circuit into a power-saving mode, then this processor generally has no information about the present operating state of the other processors or second switching units. The processor requesting the power-saving mode is thus not readily able to turn off the voltage supply for the other circuit units, particularly for the second circuit units SE2, simultaneously, since these circuit units may be in an operating state whose termination might result in a loss of data or instructions. The other circuit units thus need to be able to have operations in progress concluded, and also need to be able to transmit data from the storage elements which are to be turned off to a permanently available memory area, before finally all circuit units are isolated from the supply voltage.

The method described below solves this problem situation in a simple fashion. The control apparatus SV is provided with one (or more) signals from a circuit unit which can initiate the change to a power-saving mode. If one or more of these signals become active, the control apparatus SV initiates the change from the regular operating state to the power-saving mode. To this end, the control apparatus SV is connected to the control units SV of each second circuit unit SE2. The control apparatus SV uses the line SVL2 to inform the second circuit units SE2, more precisely the respective control units SSV, that the intention is to change to the power-saving mode. Each control unit SSV then performs the appropriate operations in order to put the second circuit units into a safe operating state, and notifies the control apparatus SV that it is in a safe operating state and can now be turned off.

When all second circuit units are in a safe operating state, the control apparatus turns them off by applying the signals described further above to each control unit SSV. It is naturally also possible for the second circuit units to be turned off individually in succession. This is possible if none of these second circuit units is required any longer by a circuit unit which is still active, e.g. for the purpose of making safe its state.

Before the supply voltage for respective second circuit units is turned off, it is still necessary to perform the electrical isolation described in connection with FIGS. 1 to 5. To this end, the second circuit units each contain the aforementioned control unit SSV. If all second circuit units are turned off synchronously, all of the control units SSV can receive the same signal dpm_isolate. Accordingly, the control units SSV can receive different signals if they are turned off successively.

The transfer of all circuit units from the power-saving state to the regular operating state is likewise prompted by the control apparatus SV. To this end, the circuit units which can be turned off receive a further "wakeup reset" signal in addition to the reset signal which is normally provided. This is helpful, when changing to the regular operating state, for distinguishing between the normal reset and the change from the power-saving mode to the operating state.

The control apparatus controls the timing of the state changes and uses signals to control the switches which are turned on and off by the voltage supply on the respective circuit units.

The invention proposes an integrated circuit which, when changing from an operating state to a power-saving mode, allows electrical isolation between circuit units which can readily be turned off and circuit units which need to buffer-store information for further processing. In this case, it is possible to change to the power-saving state with minimal involvement in terms of energy and time.

What is claimed is:

1. An integrated circuit comprising:
   a first circuit unit, which is put into a power-saving mode by a control apparatus and into a predetermined initial state when changing from the power-saving mode to a regular operating state, and is configured to operate with a source potential; and
   a second circuit unit, which is put into a power-saving mode by the control apparatus, during which the second circuit unit buffer-stores data and/or instructions adopted immediately prior to the power-saving state before changing to the power-saving mode, with the second circuit unit resuming and providing the data and/or instructions when changing from the power-saving mode to the regular operating state,
   wherein the second circuit unit has an input connection to which the source potential is applied in order to change to the power-saving mode and during the power-saving mode, and to which a reference potential is applied in order to change to the operating state and during the operating state.

2. The circuit as claimed in claim 1, wherein the second circuit unit has a plurality of further input connections which do not have a defined potential in the power-saving mode.

3. The circuit as claimed in claim 1, wherein the second circuit unit has a control unit configured to control and monitor the buffer-storage of the data and instructions when changing from the operating state to the power-saving mode.

4. The circuit as claimed in claim 3, wherein the input connection is connected to the control unit.

5. The circuit as claimed in claim 4, wherein the control unit comprises a switching unit which is connected to the input connection and is configured to convert an external clock signal and an external reset signal into an internal clock signal and an internal reset signal.

6. The circuit as claimed in claim 5, wherein the control unit further comprises a status monitoring section which is connected to the switching unit and is configured to prevent the second circuit unit from changing to the power-saving mode while the second circuit unit is still active.

7. The circuit as claimed in claim 1, wherein the circuit has at least one further second circuit unit.

8. The circuit as claimed in claim 7, wherein each of the second circuit units has a control unit.

9. The circuit as claimed in claim 7, wherein each of the second circuit units is connected to the control apparatus.

10. The circuit as claimed in claim 7, wherein one of the second circuit units is able to change only when each of the second circuit units has reached a safe operating state.

11. A method for operating the integrated circuit as claimed in claim 1, the method comprising:
applying the reference potential to the input connection of the second circuit unit while the second circuit unit is operating;
applying the source potential to the input connection of the second circuit unit in order to change from the operating state to the power-saving mode and during the power-saving mode; and
applying the reference potential to the input connection of the second circuit unit again in order to change from the power-saving mode to the operating state.

12. The method as claimed in claim 11, wherein the operating state of the integrated circuit is controlled and monitored by the control apparatus.

13. The method as claimed in claim 11, wherein the change from the operating state to the power-saving mode occurs only when the second circuit unit has reached a safe operating state.

14. The method as claimed in claim 11, wherein the circuit has a plurality of second circuit units, and one of the second circuit units changes only when each of the second circuit units has reached a safe operating state.

15. The method as claimed in claim 14, wherein the plurality of second circuit units are put into the power-saving state synchronously or successively.

16. An integrated circuit comprising:
a first circuit unit, which is put into a power-saving mode by a control apparatus and into a predetermined initial state when changing from the power-saving mode to a regular operating state; and
a second circuit unit, which is put into a power-saving mode by the control apparatus, during which the second circuit unit buffer-stores data and/or instructions adopted immediately prior to the power-saving state, with the second circuit unit resuming and providing the data and/or instructions when changing from the power-saving mode to the regular operating state, wherein the second circuit unit comprises:
an input connection to which a first potential is applied in order to change to the power-saving mode and during the power-saving mode, and to which a second potential is applied in order to change to the operating state and during the operating state; and
a control unit configured to control and monitor the buffer-storage of the data and instructions when changing from the operating state to the power-saving mode, wherein the control unit comprises:
a switching unit which is connected to the input connection and which is configured to convert an external clock signal and an external reset signal into an internal clock signal and an internal reset signal; and
a clock generator which is connected to the switching unit and is configured to be supplied with the internal clock signal and with the internal reset signal in order to produce a further clock signal and a further reset signal.

17. The circuit as claimed in claim 16, wherein the control unit further comprises a storage unit and a register arrangement, which are each connected to the clock generator and are configured to be supplied with the further clock signal.

18. The circuit as claimed in claim 16, wherein the control unit further comprises a register arrangement, which is connected to the clock generator and is configured to be supplied with the further reset signal.

19. An integrated circuit comprising:
a first circuit means, which is put into a power-saving mode by a control apparatus and into a predetermined initial state when changing from the power-saving mode to a regular operating state, and which operates with a source potential; and
a second circuit means, which is put into a power-saving mode by the control apparatus, during which the second circuit means buffer-stores data and/or instructions adopted immediately prior to the power-saving state before changing to the power-saving mode, with the second circuit means resuming and providing the data and/or instructions when changing from the power-saving mode to the regular operating state,
wherein the second circuit means has an input connection to which the source potential is applied in order to change to the power-saving mode and during the power-saving mode, and to which a reference potential is applied in order to change to the operating state and during the operating state.

20. The circuit as claimed in claim 19, wherein the second circuit means has a control means for controlling and monitoring the buffer-storage of the data and instructions when changing from the operating state to the power-saving mode.

21. The circuit as claimed in claim 20, wherein the control means comprises a switching means, which is connected to the input connection, for converting an external clock signal and an external reset signal into an internal clock signal and internal reset signal.

22. An integrated circuit comprising:
a first circuit means, which is put into a power-saving mode by a control apparatus and into a predetermined initial state when changing from the power-saving mode to a regular operating state; and
a second circuit means, which is put into a power-saving mode by the control apparatus, during which the second circuit means buffer-stores data and/or instructions adopted immediately prior to the power-saving state, with the second circuit means resuming and providing the data and/or instructions when changing from the power-saving mode to the regular operating state, wherein the second circuit means comprises:
an input connection to which a first potential is applied in order to change to the power-saving mode and during the power-saving mode, and to which a second potential is applied in order to change to the operating state and during the operating state; and
a control means for controlling and monitoring the buffer-storage of the data and instructions when changing from the operating state to the power-saving mode, wherein the control means comprises:
a clock generating means, which is connected to the switching means and is supplied with the internal clock signal and with the internal reset signal, for producing a further clock signal and a reset signal; and a switching means, which is connected to the input connection, for converting an external clock signal and an external reset signal into an internal clock signal and internal reset signal.

23. The circuit as claimed in claim 22, wherein the control means further comprises a storage means and a register arrangement, which are each connected to the clock generator and are supplied with the further clock signal.

24. The circuit as claimed in claim 22, wherein the control means further comprises a register arrangement, which is connected to the clock generator and is supplied with the further reset signal.

* * * * *